(12) United States Patent
Huang (10) Patent No.: US 9,948,282 B2
(45) Date of Patent: Apr. 17, 2018

(54) LOW-POWER RETENTION FLIP-FLOPS

(71) Applicant: MediaTek Inc., Hsin-Chu (TW)

(72) Inventor: Rei-Fu Huang, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 14/922,405

(22) Filed: Oct. 26, 2015

(65) Prior Publication Data

US 2016/0211831 A1  Jul. 21, 2016

Related U.S. Application Data

(60) Provisional application No. 62/103,729, filed on Jan. 15, 2015.

(51) Int. Cl.
*H03K 3/012* (2006.01)
*H03K 3/037* (2006.01)

(52) U.S. Cl.
CPC ........... *H03K 3/012* (2013.01); *H03K 3/0372* (2013.01); *H03K 3/0375* (2013.01)

(58) Field of Classification Search
CPC ..... H03K 3/012; H03K 3/0372; H03K 3/0375
See application file for complete search history.

(56) References Cited

U.S. PATENT DOCUMENTS

| | | | | |
|---|---|---|---|---|
| 6,351,151 B2* | 2/2002 | Kumar | ........................... | 326/95 |
| 7,649,393 B2* | 1/2010 | Maeda | ................... | H03K 3/012 |
| | | | | 327/198 |
| 8,242,826 B2* | 8/2012 | Chi | ................... | H03K 3/356008 |
| | | | | 327/203 |
| 8,274,319 B2* | 9/2012 | Maeno | ............. | H03K 3/356156 |
| | | | | 327/203 |

* cited by examiner

*Primary Examiner* — Hai L Nguyen
(74) *Attorney, Agent, or Firm* — McClure, Qualey & Rodack, LLP (57) ABSTRACT

A retention flip-flop is provided. The flip-flop includes a clock generation circuit, a master latch circuit, and a salve latch circuit. The clock generation circuit generates first and second clock signals in a first mode. The master latch circuit performs a first latch operation on an input signal from the input terminal according to the first and second clock signals to generate a first latched signal at a first node in the first mode. The salve latch circuit performs a second latch operation on the first latched signal according to the first and second clock signals to generate a second latched signal at a second node in the first mode. In a sleep or power-down mode, the total number of transistors in the clock generation circuit and the salve latch circuit is equal to or less than eight.

6 Claims, 9 Drawing Sheets

FIG. 9

LOW-POWER RETENTION FLIP-FLOPS

CROSS REFERENCE TO RELATED APPLICATIONS

This application claims the benefit of U.S. Provisional Application No. 62/103,729, filed on Jan. 15, 2015, the contents of which are incorporated herein by reference.

BACKGROUND OF THE INVENTION

Field of the Invention

The invention relates to a flip-flop, and more particularly, to a low-power retention flip-flop.

Description of the Related Art

A conventional retention flip-flop is a memory storage device that typically retains stored data when it is powered to operate normally (or "turned on"). While the retention flip-flop is switched to a sleep or power-down mode, the stored data may be still retained. At this time, some elements or devices in the flip-flop are stilled powered to retain data, however, which consumes power due to the leakage current induced in these elements or devices and degrades the efficiency. Thus, low power design of the flip-flop can be achieved by using less elements or devices which are powered in the sleep or power-down mode.

BRIEF SUMMARY OF THE INVENTION

Thus, it is desirable to provide a retention flip-flop which is capable of keeping data by lower power.

An exemplary embodiment of a flip-flop is provided. The flip-flop has an input terminal and an output terminal and comprises a clock generation circuit, a master latch circuit, and a slave latch circuit. The clock generation circuit generates a first clock signal and a second clock signal inverse to the first clock signal when the flip-flop is in a first mode. The master latch circuit performs a first latch operation on an input signal from the input terminal according to the first clock signal and the second clock signal to generate a first latched signal at a first node when the flip-flop is in the first mode. The slave latch circuit is coupled to the first node. The slave latch circuit performs a second latch operation on the first latched signal according to the first clock signal and the second clock signal to generate a second latched signal at a second node when the flip-flop is in the first mode. The second latched signal is coupled to the output terminal of the flip-flop and comprises a first inverter, a first pass gate, and a second inverter. The first inverter has an input terminal coupled to the first node and an output terminal coupled to the second node. The first pass gate is coupled between the second node and a third node. The second inverter has an input terminal coupled to the third node and an output terminal coupled to the input terminal of the first inverter.

Another exemplary embodiment of a flip-flop is provided. The flip-flop has an input terminal and an output terminal. The flip-flop comprises a clock generation circuit, a master latch circuit, and a slave match circuit. The clock generation circuit generates a first clock signal and a second clock signal inverse to the first clock signal when the flip-flop is in a first mode. The master latch circuit performs a first latch operation on an input signal from the input terminal according to the first clock signal and the second clock signal to generate a first latched signal at a first node when the flip-flop is in the first mode. The slave latch circuit is coupled to the first node. The slave latch circuit performs a second latch operation on o the first latched signal according to the first clock signal and the second clock signal to generate a second latched signal at a second node when the flip-flop is in the first mode. The second latched signal is coupled to the output terminal of the flip-flop and comprises a first inverter, a second inverter, a first pass gate, and a first transistor. The first inverter has an input terminal coupled to the first node and an output terminal coupled to the second node. The second inverter has an input terminal coupled to the second node and an output terminal coupled to a third node. The first pass gate is coupled between the third node and the input terminal of the first inverter. The first transistor has a control terminal coupled to the third node, a first terminal coupled to a first voltage source, and a second terminal coupled to the second node.

Another exemplary embodiment of a flip-flop is provided. The flip-flop has an input terminal and an output terminal. The flip-flop comprises a clock generation circuit, a master latch circuit, and a slave match circuit. The clock generation circuit generates a first clock signal and a second clock signal inverse to the first clock signal when the flip-flop is in a first mode. The master latch circuit performs a first latch operation on an input signal from the input terminal according to the first clock signal and the second clock signal to generate a first latched signal at a first node when the flip-flop is in the first mode. The slave latch circuit is coupled to the first node. The slave latch circuit performs a second latch operation on the first latched signal according to the first clock signal and the second clock signal to generate a second latched signal at a second node when the flip-flop is in the first mode. The second latched signal is coupled to the output terminal of the flip-flop. When the flip-flop is in a second mode, the master latch circuit stops performing the first latch operation, and the slave latch circuit latches the first latched signal generated at the first node.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
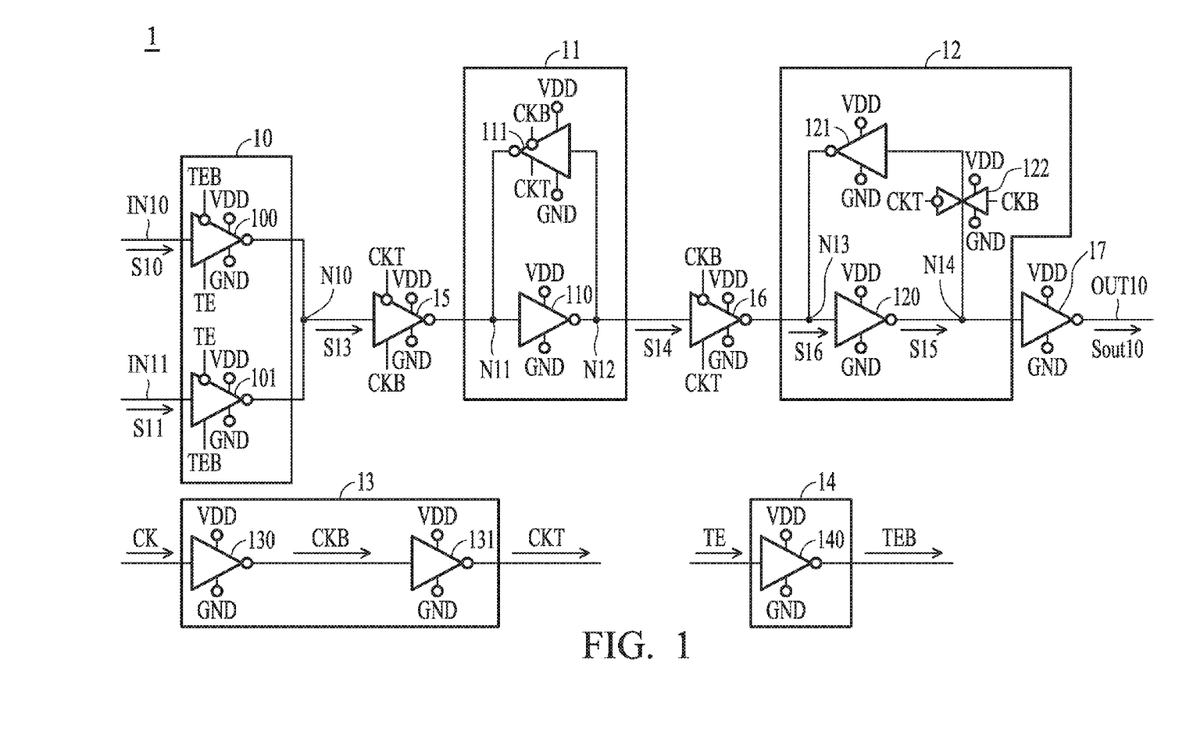
FIGS. 1 and 6 shown one exemplary embodiment of a retention flip-flop.

FIG. 1 shows one exemplary embodiment of a retention flip-flop. As shown in FIG. 1, a retention flip-flop 1 has at least one input terminal and an output terminal OUT10 and comprises an input interface circuit 10, a master latch circuit 11, a slave latch circuit 12, clock generation circuits 13 and 14, and inverters 15-17. In the embodiment of FIG. 1, the flip-flop 1 having two input terminals IN10 and IN11 is given as an example. The clock generation circuit 13 comprises two inverters 130 and 131 which are coupled in series. The clock generation circuit 14 comprises an inverter 140. The input interface circuit 10 comprises two inverters 100 and 101. An input terminal of the inverter 100 is coupled to the input terminal IN10, and an output terminal thereof is coupled to a node N10. An input terminal of the inverter 101 is coupled to the input terminal IN11, and an output terminal thereof is coupled to the node N10. An input terminal of the inverter 15 is coupled to the node N10, and an output terminal thereof is coupled to a node N11. The master latch circuit 11 comprises inverters 110 and 111. An input terminal of the inverter 110 is coupled to the node N11, and an output terminal thereof is coupled to a node N12. An input terminal of the inverter 111 is coupled to the node N12, and an output terminal thereof is coupled to the node N11. An input terminal of the inverter 16 is coupled to the node N12, and an output terminal thereof is coupled to a node N13.

The slave latch circuit 12 comprises two inverters 120 and 121 and a pass gate 122. An input terminal of the inverter 120 is coupled to the node N13, and an output terminal thereof is coupled to a node N14. The pass gate 122 is coupled between the node N14 and a node N15. An input terminal of the inverter 121 is coupled to the node N15, and an output terminal thereof is coupled to the node N13. An input terminal of the inverter 17 is coupled to the node N14, and an output terminal thereof is coupled to the output terminal OUT10.

In the embodiment, the inverters 100. 101, and 111 are tri-state inverters. The inverters 15 and 16 are implemented by tri-state inverters.

In the embodiment, the flip-flop 1 may be in different modes, such as a normal mode and a specific mode (sleep or power-down mode). When the flip-flop operates in the normal mode, the input interface circuit 10, the master latch circuit 11, the slave latch circuit 12, the clock generation circuits 13 and 14, and the inverters 15-17 are powered. That is, in the normal mode, a supply voltage VDD and a reference ground voltage GND for enabling the elements to operate are provided to the elements (such as transistors) in the input interface circuit 10, the master latch circuit 11, the slave latch circuit 12, the clock generation circuits 13 and 14, and the inverters 15-17, as shown in FIG. 1. In the following, the operation of the flip-flop 1 will be described.

At the normal mode, the input terminal IN10 receives an external signal S10, and the input terminal IN11 receives another external signal S11 which is inverse to the terminal signal S10. The clock generation circuit 13 receives a clock signal CK, and the clock generation circuit 14 receives a clock signal TE. In detailed, the inverter 130 receives the clock signal CK and inverts the clock signal CK to generate a clock signal CKB. The inverter 131 receives the clock signal CKB and inverts the clock signal CKB to generate a clock signal CKT. The inverter 140 receives the clock signal TE and inverts the clock signal TE to generate a clock signal TEB.

At the normal mode, in the input interface circuit 10, each of the inverters 100 and 101 is controlled by the clock signals TE and TEB from the clock generation circuit 14 to operate. Through the control of the clock signals TE ad TEB, the inverters 100 and 101 invert the external signals S10 and S11 at different time to generate an input terminal S13. When the inverter 100 inverts the external signal S10 according to the clock signals TE and TEB, the inverted external signal S10 is generated at the node N10 to serve as the input signal S13. When the inverter 101 inverts the external signal S11 according to the clock signals TE and TEB, the inverted external signal S11 is generated at the node N10 to serve as the input signal S13. The inverter 15 which is controlled by the clock signals CKB and CKT inverts the input signal S13 and transmits the inverted input signal S13 to the node N11.

At the normal mode, in the master latch circuit 11, the inverter 111 is controlled by the clock signals CKB and CKT to operate. The master latch circuit 11 receives the input signal S13 which is inverted by the inverter 15 and performs a latch operation on the input signal S13 through the inverters 100 and 101 to generate a latched signal S14 at the node N12. The inverter 16 which is controlled by the clock signals CKB and CKT inverts the input signal S14 and transmits the inverted latched signal S14 to the node N13.

In the normal mode, in the slave latch circuit 12, the pass gate 122 is controlled by the clock signals CKB and CKT. The slave latch circuit 12 receives the latched signal S14 which is inverted by the inverter 16 and performs a latch operation on the latched signal S14 through the inverters 120 and 121 and the pass gate 122 to generate a latched signal S15 at the node N14. The inverter 17 inverts the latched S15 and transmits the inverted latched signal S15 to the output terminal OUT10 to serve as an output signal Sout10 of the flip-flip 1.

When the flip-flop 1 is switched to be at the specific mode, such as sleep or power-down mode, some elements in the flip-flop is not powered, while some elements in the flip-flop 1 are still powered to keep the last latched signal S15 generated at the node N14 before the specific mode. In the following, the operation of the flip-flop 1 will be described.

Figure 6:
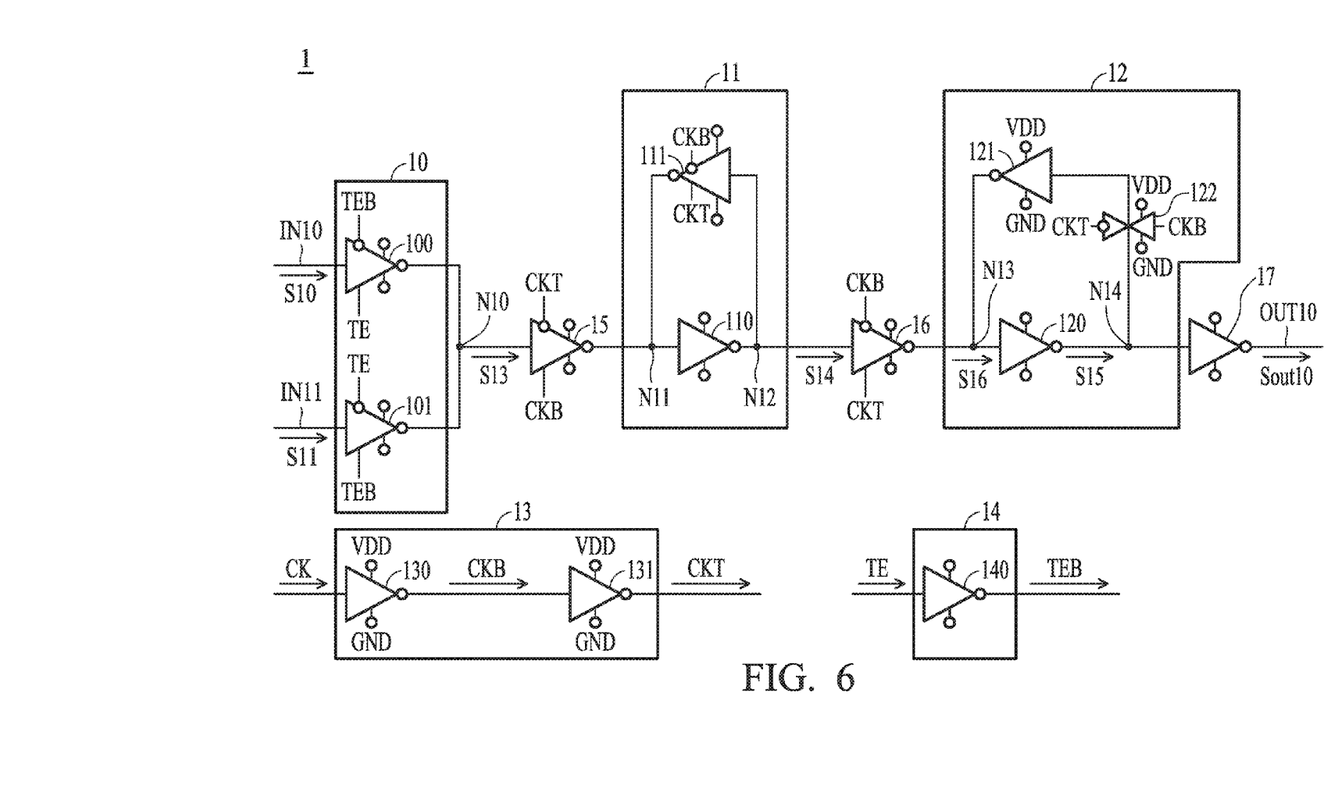

In the specific mode, the input interface circuit 10, the master latch circuit 11, the clock generation circuit 14, and the inverters 15-17 are not powered to operate. That is, in the specific mode, the supply voltage VDD and the reference ground voltage GND for enabling elements to operate are not provided to the input interface circuit 10, the master latch circuit 11, and the clock generation circuit 14, and the inverters 15-17, as shown in FIG. 6, and these circuits or devices do not operate to generate the corresponding signals, such as the latched signals and the clock signals. For example, in the specific mode, the clock generation circuit 14 stops generating the clock signal TEB, and the master latch circuit 11 stops performing the latch operation on the input signal S13. Moreover, referring to FIG. 6, the inverter 120 in the slave latch circuit 12 is also not powered. In the specific mode, the inverter 121 and the pass gate 122 in the slave latch circuit 12 and the clock generation circuit 13 are powered. That is, as shown in FIG. 6, the supply voltage and the reference ground voltage are provided to the inverter 121, the pass gate 122, and the slave latch circuit 12 performs a latch operation on the last latched signal S15, which is generated at the node N14 before the specific mode, through the inverter 121 and the pass gate 122 to generate a latched signal S16 at the node N13 thereby keeping the latched signal S15. After the flip-flop 1 is switched to the normal mode, the latched signal S16 is then inverted by the inverter 120 and the inverter 17 to generate the output signal Sout10 at the output terminal OUT10 of the flip-flip 1.

In the embodiment, each of the inverter 121 and the pass gate 122 in the slave latch circuit 12 is implemented by a plurality of transistors, and each of the inverters 130 and 131 in the clock generation circuit 13 is implemented by a plurality of transistors. In the specific mode, the number of transistors in the inverter 121, the pass gate 122, and the clock generation circuit 13 which are powered is eight.

In the above embodiment, the structures of the input interface circuit 10, the master latch circuit 11, and the clock generation circuits 13 and 14 are exemplary structures. The structures of the input interface circuit 10, the master latch circuit 11, and the clock generation circuits 13 and 14 can be determined according to the requirement in the design of the flip-flop 1.

Figure 2:
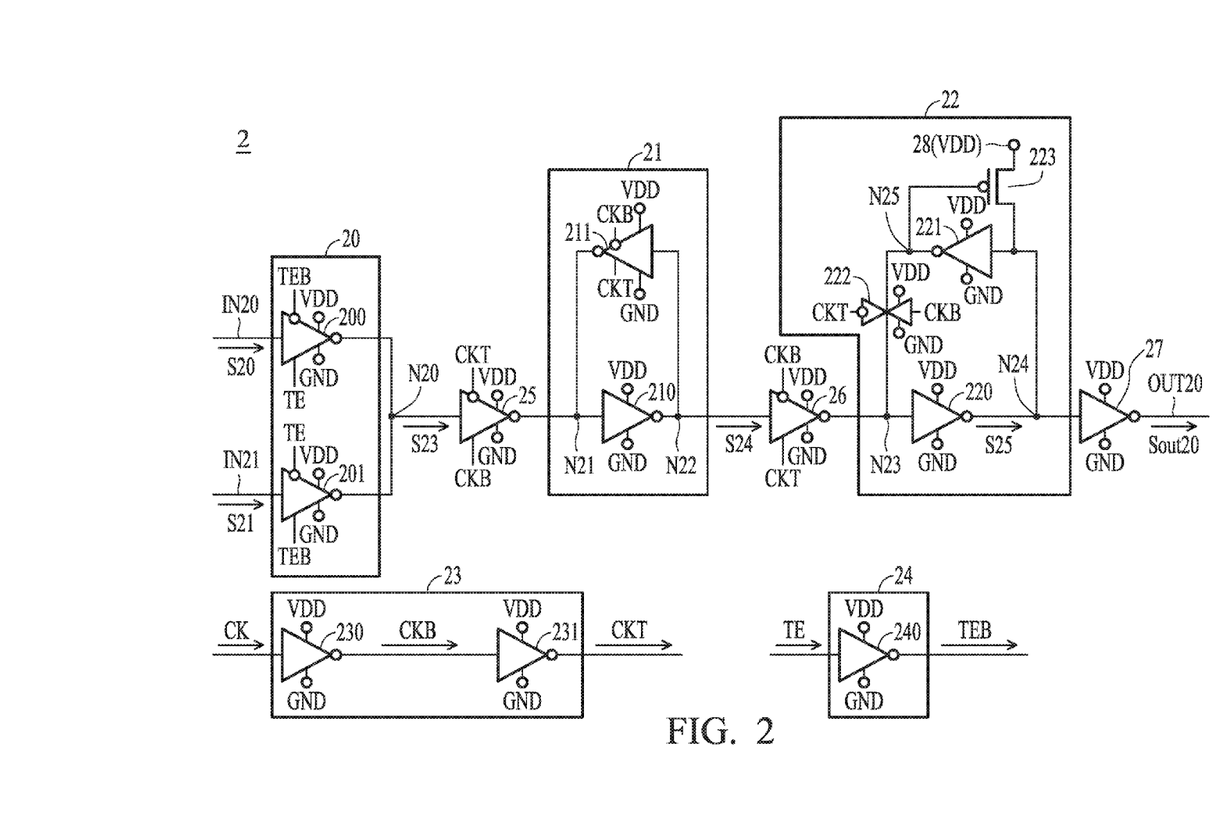
FIGS. 2 and 7 show another exemplary embodiment of a retention flip-flop.

FIG. 2 shows another exemplary embodiment of a retention flip-flop. As shown in FIG. 2, a retention flip-flop 1 has at least one input terminal and an output terminal OUT20 and comprises an input interface circuit 20, a master latch circuit 21, a slave latch circuit 22, clock generation circuits 23 and 24, and inverters 25-27. In the embodiment of FIG. 2, the flip-flop 2 having two input terminals IN20 and IN21 is given as an example. The clock generation circuit 23 comprises two inverters 230 and 231 which are coupled in series. The clock generation circuit 24 comprises an inverter 240. The input interface circuit 20 comprises two inverters 200 and 201. An input terminal of the inverter 200 is coupled to the input terminal IN20, and an output terminal thereof is coupled to a node N20. An input terminal of the inverter 201 is coupled to the input terminal IN21, and an output terminal thereof is coupled to the node N20. An input terminal of the inverter 25 is coupled to the node N20, and an output terminal thereof is coupled to a node N21. The master latch circuit 21 comprises inverters 210 and 211. An input terminal of the inverter 210 is coupled to the node N21, and an output terminal thereof is coupled to a node N22. An input terminal of the inverter 211 is coupled to the node N22, and an output terminal thereof is coupled to the node N21. An input terminal of the inverter 26 is coupled to the node N22, and an output terminal thereof is coupled to a node N23.

The slave latch circuit 22 comprises two inverters 220 and 221, a pass gate 222, and a P-type transistor 223. An input terminal of the inverter 220 is coupled to the node N23, and an output terminal thereof is coupled to a node N24. An input terminal of the inverter 221 is coupled to the node N24, and an output terminal thereof is coupled to the node N25. The pass gate 222 is coupled between the node N25 and the node N123. A gate (control terminal) of the P-type transistor 223 is coupled to the node N25, a source (first terminal) thereof is coupled to a voltage source 28, and a drain (second terminal) thereof is coupled to the node N24. In the embodiment, the P-type transistor 223 is implemented by a P-type metal oxide semiconductor (PMOS) transistor. An input terminal of the inverter 27 is coupled to the node N24, and an output terminal thereof is coupled to the output terminal OUT20.

In the embodiment, the inverters 200. 201, and 211 are tri-state inverters. The inverters 25 and 26 are implemented by tri-state inverters.

In the embodiment, the flip-flop 2 may be in different modes, such as a normal mode and a specific mode (sleep or power-down mode). When the flip-flop 2 operates in the normal mode, the input interface circuit 20, the master latch circuit 21, the slave latch circuit 22, the clock generation circuits 23 and 24, and the inverters 25-27 are powered. That is, in the normal mode, a supply voltage VDD and a reference ground voltage GND for enabling the elements to operate are provided to the elements (such as transistors) in the input interface circuit 20, the master latch circuit 21, the slave latch circuit 22, the clock generation circuits 23 and 24, and the inverters 25-27, as shown in FIG. 2. In the following, the operation of the flip-flop 2 will be described.

At the normal mode, the input terminal IN20 receives an external signal S20, and the input terminal IN21 receives another external signal S21 which is inverse to the terminal signal S20. The clock generation circuit 23 receives a clock signal CK, and the clock generation circuit 24 receives a clock signal TE. In detailed, the inverter 230 receives the clock signal CK and inverts the clock signal CK to generate a clock signal CKB. The inverter 231 receives the clock signal CKB and inverts the clock signal CKB to generate a clock signal CKT. The inverter 240 receives the clock signal TE and inverts the clock signal TE to generate a clock signal TEB.

At the normal mode, in the input interface circuit 20, each of the inverters 200 and 201 is controlled by the clock signals TE and TEB from the clock generation circuit 24 to operate. Through the control of the clock signals TE ad TEB, the inverters 200 and 201 invert the external signals S20 and S21 at different time to generate an input terminal S23. When the inverter 200 inverts the external signal S20 according to the clock signals TE and TEB, the inverted external signal S20 is generated at the node N20 to serve as the input signal S23. When the inverter 201 inverts the external signal S21 according to the clock signals TE and TEB, the inverted external signal S21 is generated at the node N20 to serve as the input signal S23. The inverter 25 which is controlled by the clock signals CKB and CKT inverts the input signal S23 and transmits the inverted input signal S23 to the node N21.

At the normal mode, in the master latch circuit 21, the inverter 211 is controlled by the clock signals CKB and CKT to operate. The master latch circuit 21 receives the input signal S23 which is inverted by the inverter 25 and performs a latch operation on the input signal S23 through the inverters 200 and 201 to generate a latched signal S24 at the node N22. The inverter 26 which is controlled by the clock signals CKB and CKT inverts the input signal S24 and transmits the inverted latched signal S24 to the node N23.

In the normal mode, the supply voltage VDD is provided by the voltage source 28. In the slave latch circuit 12, the pass gate 222 is controlled by the clock signals CKB and CKT, and the supply voltage VDD is provided by the voltage source 28. The slave latch circuit 22 receives the latched signal S24 which is inverted by the inverter 26 and performs a latch operation on the latched signal S24 through the inverters 220 and 221, the pass gate 222, and the P-type transistor 223 to generate a latched signal S25 at the node N24. The inverter 27 inverts the latched S25 and transmits the inverted latched signal S25 to the output terminal OUT20 to serve as an output signal Sout of the flip-flip 2.

When the flip-flop 2 is switched to be in the specific mode, such as sleep or power-down mode, some elements in the flip-flop is not powered, while some elements in the flip-flop 2 are still powered to keep the last latched signal S25 generated at the node N24 before the specific mode. In the following, the operation of the flip-flop 2 will be described.

Figure 7:
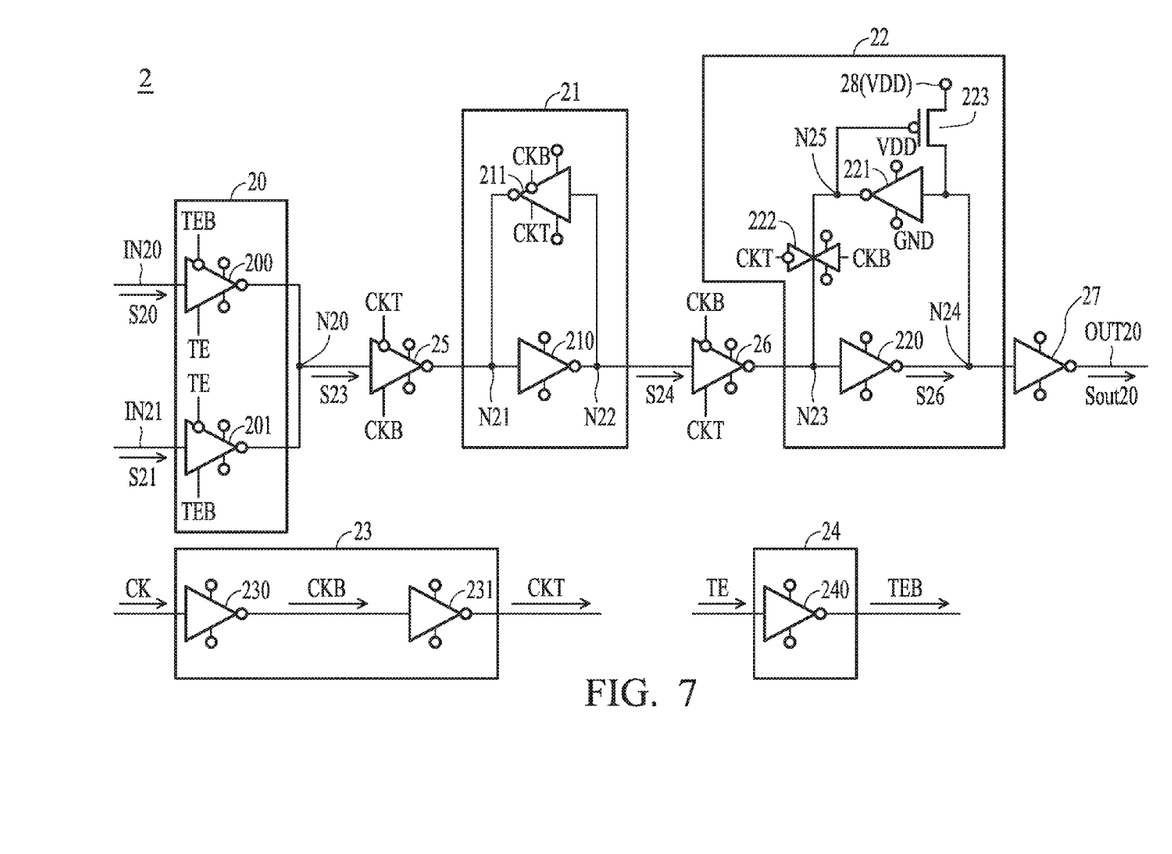

In the specific mode, the input interface circuit 20, the master latch circuit 21, the clock generation circuits 23 and 24, and the inverters 25-27 are not powered to operate. That is, at the specific, the supply voltage VDD and the reference ground voltage for enabling elements to operate are not provided to the input interface circuit 20, the master latch circuit 21, and the clock generation circuits 23 and 24, and the inverters 25-27, as shown in FIG. 7, and these circuits or devices do not operate to generate the corresponding signals, such as the latched signals and the clock signals. For example, in the specific mode, the clock generation circuit 13 stops generating the clock signals CKB and CKT, the clock generation circuit 14 stops generating the clock signal TEB, and the master latch circuit 11 stops performing the latch operation on the input signal S13. Moreover, referring to FIG. 7, the inverter 220 and the pass gate 222 in the slave latch circuit 22 are also not powered. in the specific mode, the inverter 221 and the P-type transistor 223 in the slave latch circuit 22 are powered. That is, as shown in FIG. 7, the supply voltage VDD and the reference ground voltage GND are provided to the inverter 221 and the P-type transistor 223, for example, the supply voltage VDD is provided by the voltage source 28. The slave latch circuit 22 performs a latch operation on the last latched signal S25, which is generated at the node N24 before the specific mode, through the inverter 221 and the P-type transistor 223 to generate a latched signal S26 (note that the latched signal S26 is the signal generated in the specific mode through the latch operation performed by the inverter 221 and the P-type transistor 223) at the node N24 thereby achieving the data retention. After the flip-flop 2 is switched to the normal mode, the latched signal S26 is then inverted by the inverter 27 to generate the output signal Sout20 at the output terminal OUT20 of the flip-flip 2. In the embodiment, due to the P-type transistor 223 and the supply voltage VDD, the latched signal S25 with a relatively high voltage level is kept in the specific mode In other words, in the specific mode, the output signal Sout20 with a relatively low voltage level ("0"), which is generated at the output terminal OUT20 before the specific mode, is kept by the inverter 221 and the P-type transistor 223.

In the embodiment of FIG. 2, the inverter 221 in the slave latch circuit 22 is implemented by a plurality of transistors. In the specific mode, the number of transistors in the slave latch circuit 22 which are powered is three.

In the above embodiment, the structures of the input interface circuit 20, the master latch circuit 21, and the clock generation circuits 23 and 24 are exemplary structures. The structures of the input interface circuit 20, the master latch circuit 21, and the clock generation circuits 23 and 24 can be determined according to the requirement in the design of the flip-flop 2.

Figure 3:
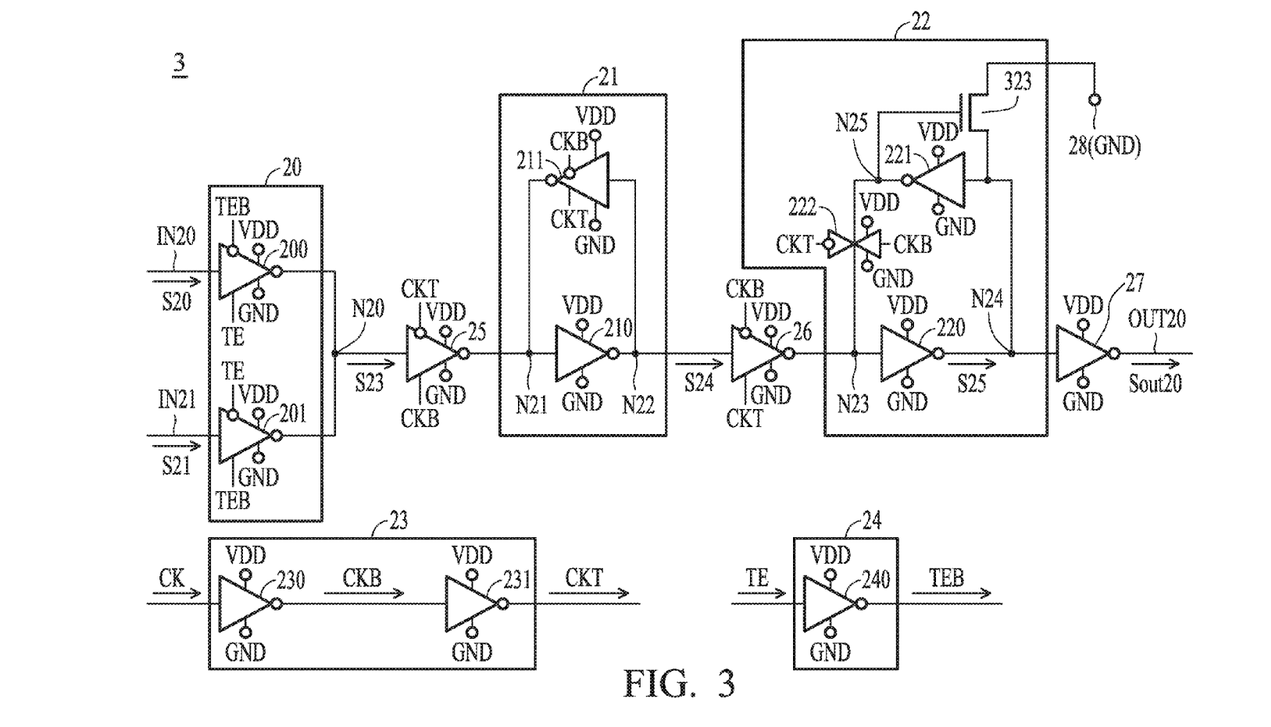
FIGS. 3 and 8 show further another exemplary embodiment of a retention flip-flop.

FIG. 3 shows further another exemplary embodiment of a retention flip-flop. The different between the flip-flop 3 shown in FIG. 3 and the flip-flop 2 shown in FIG. 2 is the structure and operation of the slave latch circuit 22. In the embodiment of FIG. 3, the slave latch circuit 22 further comprises an N-type transistor 323 replacing the P-type transistor 213 of FIG. 2A. A gate (control terminal) of the N-type transistor 323 is coupled to the node N25, a source (first terminal) thereof is coupled to the voltage source 28, and a drain (second terminal) thereof is coupled to the node N24. In the embodiment, the N-type transistor 323 is implemented by an N-type metal oxide semiconductor (NMOS) transistor.

Figure 8:
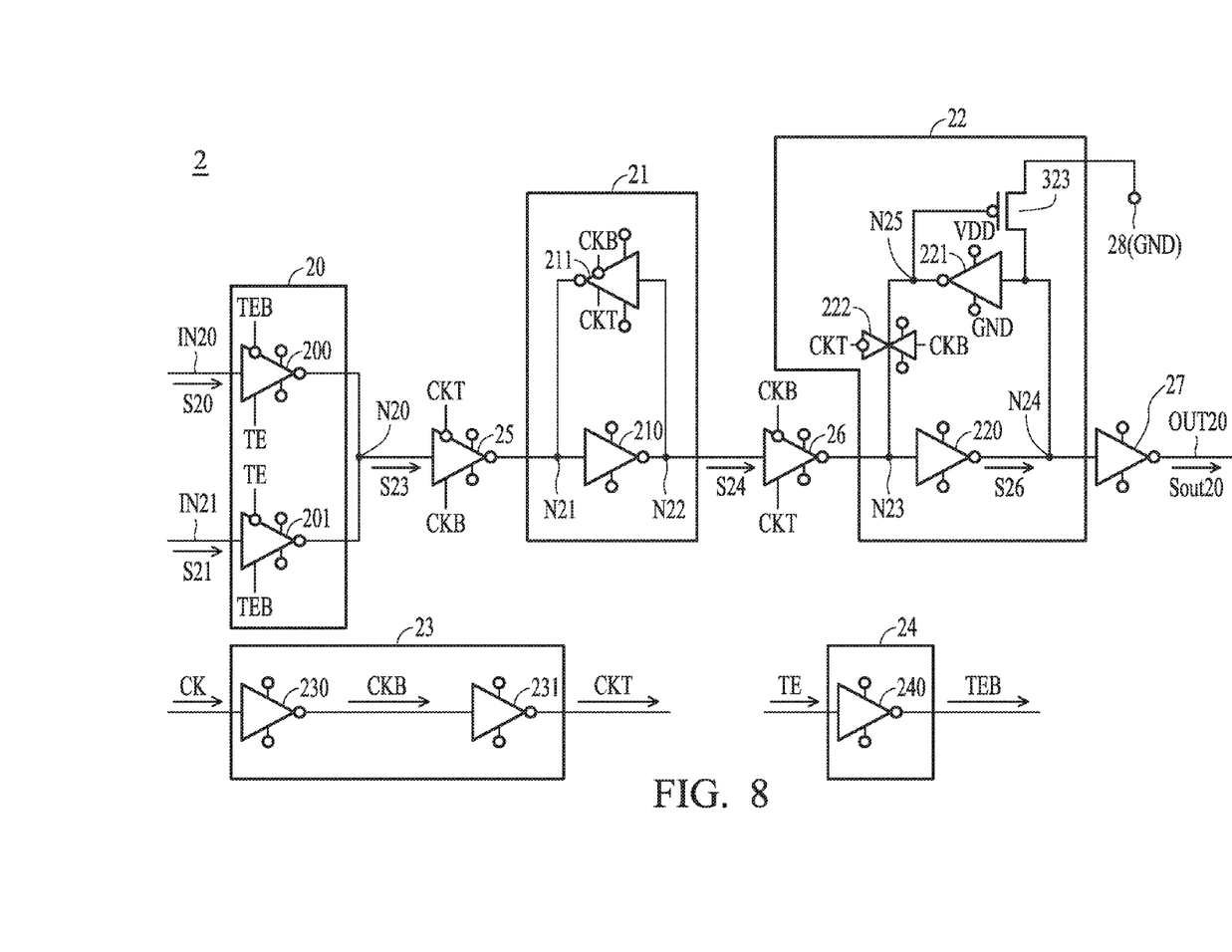

In the normal mode, as shown in FIG. 8, the reference ground voltage GND is provided by the voltage source 28. The slave latch circuit 22 receives the latched signal S24 which is inverted by the inverter 26 and performs a latch operation on the latched signal S24 through the inverters 220 and 221, the pass gate 222, and the N-type transistor 323 to generate the latched signal S25 at the node N24. The inverter 27 inverts the latched S25 and transmits the inverted latched signal S25 to the output terminal OUT20 to serve as an output signal Sout of the flip-flip 3.

In the specific mode, referring to FIG. 8, the input interface circuit 20, the master latch circuit 21, the clock generation circuits 23 and 24, and the inverters 25-27 are not powered. The inverter 220 and the pass gate 222 in the slave latch circuit 22 are also not powered. However, the inverter 221 and the N-type transistor 323 in the slave latch circuit 22 are powered. That is, as shown in FIG. 8, the supply voltage VDD and the reference ground voltage GND are provided to the inverter 221 and the N-type transistor 323, for example, the reference ground voltage GND is provided by the voltage source 28. The slave latch circuit 22 performs a latch operation on the last latched signal S25, which is generated at the node N24 before the specific mode, through the inverter 221 and the N-type transistor 323 to generate a latched signal S26 at the node N24 thereby achieving the data retention. After the flip-flop 3 is switched to the normal mode, the latched signal S26 is then inverted by the inverter 27 to generate the output signal Sout20 at the output terminal OUT20 of the flip-flip 3. In the embodiment, due to the N-type transistor 323 and the reference ground voltage GND, the latched signal S25 with a relatively low voltage level is kept in the specific mode In other words, in the specific mode, the output signal Sout20 with a relatively high voltage level ("1"), which is generated at the output terminal OUT20 before the specific mode, is kept by the inverter 221 and the N-type transistor 323.

In the embodiment of FIG. 3, the inverter 221 in the slave latch circuit 22 is implemented by a plurality of transistors. In the specific mode, the number of transistors in the slave latch circuit 22 which are powered is three.

Figure 4:
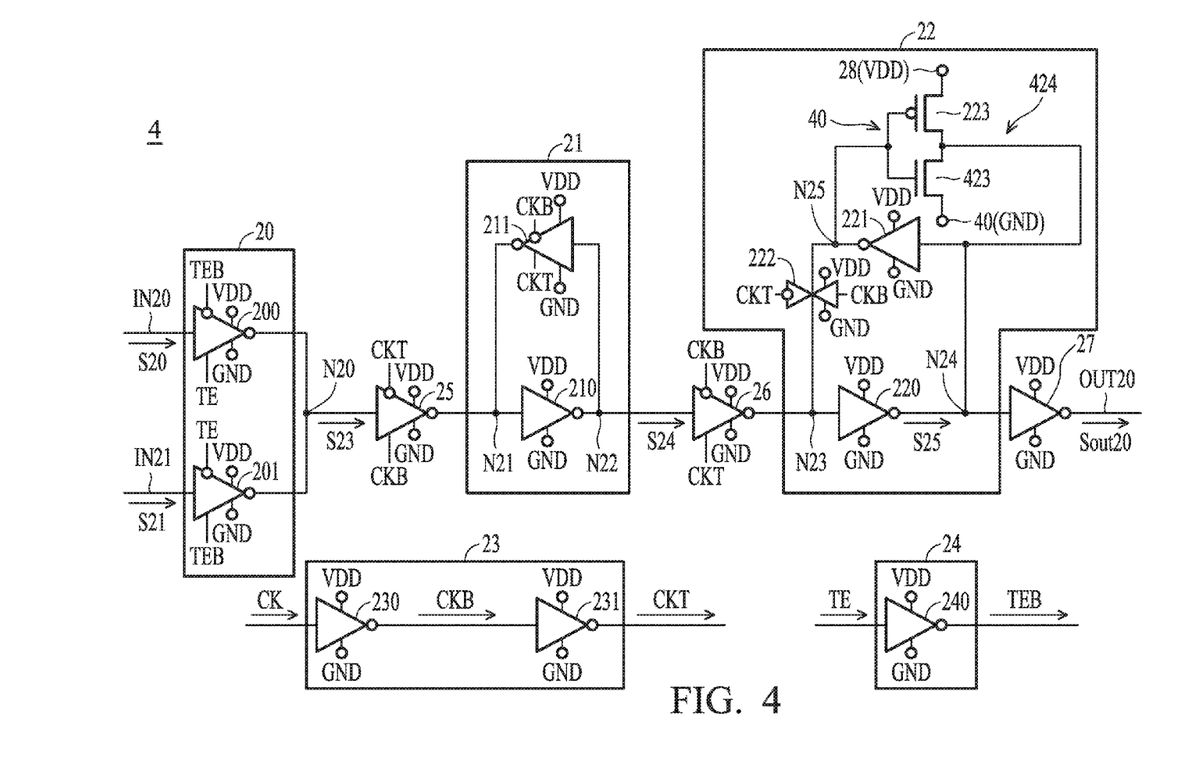
FIGS. 4 and 9 show another exemplary embodiment of a retention flip-flop.

FIG. 4 shows another exemplary embodiment of a retention flip-flop. The different between the flip-flop 4 shown in FIG. 4 and the flip-flop 2 shown in FIG. 2 is the structure and operation of the slave latch circuit 22. In the embodiment of FIG. 4, the slave latch circuit 22 further comprises an N-type transistor 423. A gate (control terminal) of the N-type transistor 423 is coupled to the node N25, a source (first terminal) thereof is coupled to a voltage source 40, and a drain (second terminal) thereof is coupled to the drain of the P-type transistor 223. In the embodiment, the N-type transistor 423 is implemented by an N-type metal oxide semiconductor (PMOS) transistor. The N-type transistor 423 and the P-type transistor 223 form an inverter 424.

At the normal mode, the supply voltage VDD is provided by the voltage source 28, while a reference ground voltage GND is provided by the voltage source 40. The salve latch circuit 22 receives the latched signal S24 which is inverted by the inverter 26 and performs a latch operation on the latched signal S24 through the inverters 220, 221, and 424, and the pass gate 222 to generate the latched signal S25 at the node N24. The inverter 27 inverts the latched S25 and transmits the inverted latched signal S25 to the output terminal OUT20 to serve as an output signal Sout of the flip-flip 4.

Figure 9:
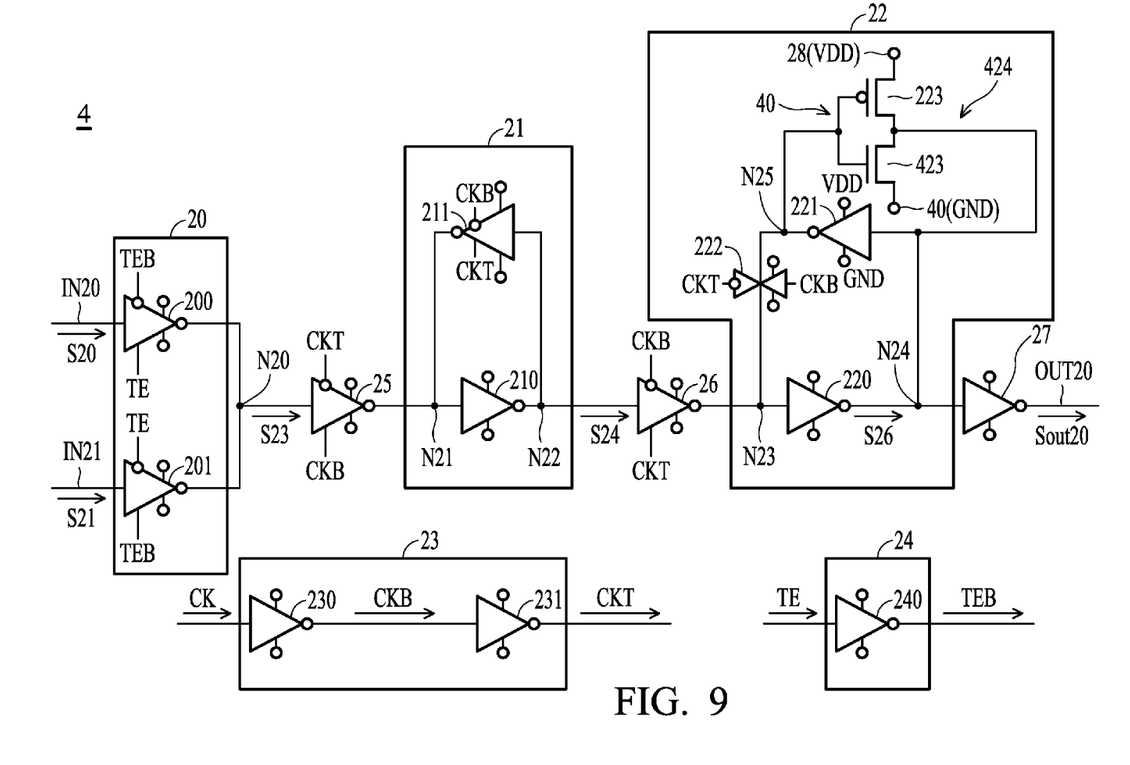

In the specific mode, referring to FIG. 9, the input interface circuit 20, the master latch circuit 21, the clock generation circuits 23 and 24, and the inverters 25-27 are not powered. The inverter 220 and the pass gate 222 in the slave latch circuit 22 are also not powered. However, the inverters 221 and 424 in the slave latch circuit 22 are powered. That is, as shown in FIG. 9, the supply voltage VDD and the reference ground voltage GND are provided to the inverters 221 and 424, for example, the supply voltage VDD is provided by the voltage source 28, and the reference ground voltage GND is provided by the voltage source 40. The slave latch circuit 22 performs a latch operation on the last latched signal S25, which is generated at the node N24 before the specific mode, through the inverters 221 and 424 to generate a latched signal S26 at the node N24 thereby achieving the data retention. After the flip-flop 3 is switched to the normal mode, the latched signal S26 is then inverted by the inverter 27 to generate the output signal Sout20 at the output terminal OUT20 of the flip-flip 4.

In the embodiment of FIG. 4, each of the inverters 221 and 424 in the slave latch circuit 22 is implemented by a plurality of transistors. In the specific mode, the number of transistors in the slave latch circuit 22 which are powered is four.

Figure 5:
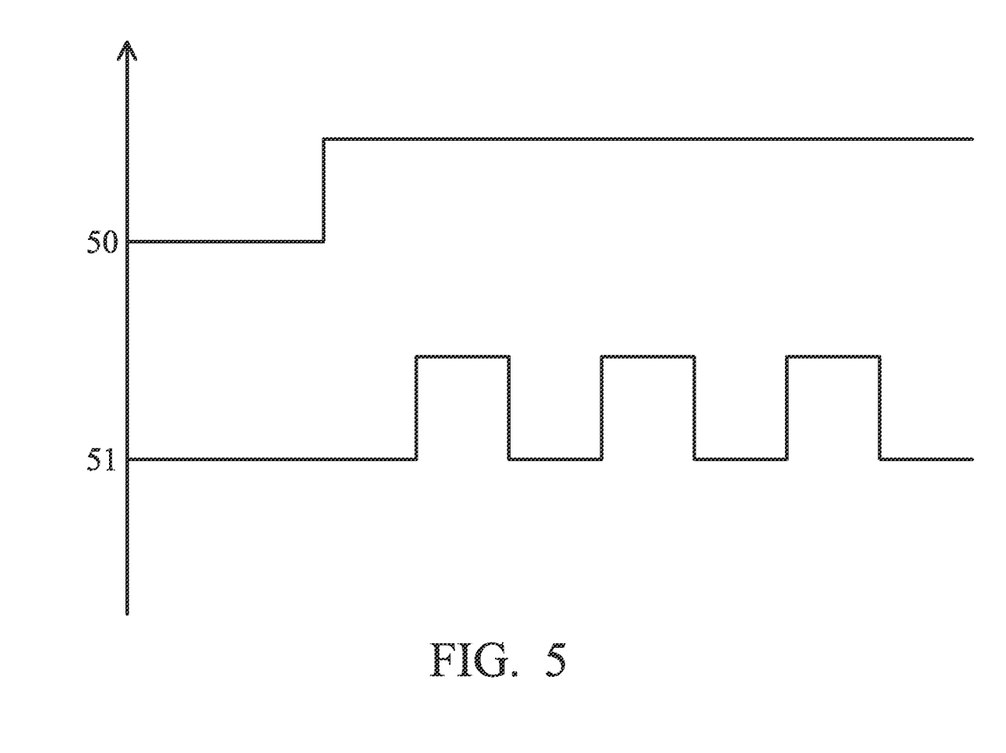
FIG. 5 shows relationship between the supplement of power and generation of clock signals.

According to the embodiments of FIGS. 2-4, the clock generation circuits 23 and 24 are powered in the normal mode, while the clock generation circuits 23 and 24 are not powered in the specific mode. Thus, the clock signals, such as CKB, CKT, and TE are active just after the clock generation circuit 23 is powered, that is after the supply voltage VDD is provided to the clock generation circuits 23 and 24. FIG. 5 shows relationship between the supplement of power and generation of clock signals. In FIG. 5, the label "50" represents that the timing of the supplement of the power for the clock generation circuit 23 or 24, that is, the supply voltage and the reference ground voltage are provided to the clock generation circuit 23 or 24. The label "51" represents that the timing of the generation of the clock signal CKB/CKT or TEB. As shown in FIG. 5, for each of clock generation circuits 23 and 24, the clock generation occurs after the supplement of the power.

According to the above embodiments, when the flip-flop is in the sleep or power-down mode, the number of elements (such as transistors) which are powered is less, thereby decreasing the power consumption for the data retention.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flip-flop having an input terminal and an output terminal, comprising:
    a clock generation circuit to generate a first clock signal and a second clock signal inverse to the first clock signal when the flip-flop is in a first mode;
    a master latch circuit to perform a first latch operation on an input signal from the input terminal according to the first clock signal and the second clock signal to generate a first latched signal at a first node when the flip-flop is in the first mode; and
    a slave latch circuit, coupled to the first node, to perform a second latch operation on the first latched signal according to the first clock signal and the second clock signal to generate a second latched signal at a second node when the flip-flop is in the first mode,
    wherein the second latched signal is coupled to the output terminal of the flip-flop, and the slave latch circuit comprises:
        a first inverter having an input terminal coupled to the first node and an output terminal coupled to the second node;
        a first pass gate coupled between the second node and a third node;
        a second inverter having an input terminal coupled to the third node and an output terminal directly connected to the input terminal of the first inverter.

2. The flip-flop claimed in claim 1,
    wherein when the flip-flop is in a second mode, the clock generation circuit is powered, and
    wherein when the flip-flop is in the second mode, in the slave latch circuit, each of the second inverter and the first pass gate is powered, and the first inverter is not powered.

3. The flip-flop claimed in claim 2, wherein each of the clock generation circuit, the second inverter, and the first pass gate comprises a plurality of transistors, and when the flip-flop is in the second mode, a number of transistors in the clock generation circuit, the second inverter, and the first pass gate which are powered is eight.

4. The flip-flop claimed in claim 2, wherein when the flip-flop is in the first mode, the slave latch circuit performs a third latch operation on the second latched signal according to the first clock signal and the second clock signal through the second inverter and the first pass gate to generate a third latched signal at the input terminal of the first inverter.

5. The flip-flop as claimed in claim 2,
    wherein when the flip-flop is in the first mode, the clock generation circuit receives the supply voltage, and
    wherein when the flip-flop is in the first mode, in the slave latch circuit, each of the first inverter, the second inverter, and the first pass gate is powered.

6. The flip-flop as claimed in claim 1, further comprising:
    an input interface circuit to receive an external signal from the input terminal of the flip-flop and transmit the external signal to the input terminal of the first inverter to serve as the input signal when the flip-flop is in the first mode;
    a third inverter, coupled between the input interface circuit and the first master latch circuit, to invert the input signal when the flip-flop is in the first mode, wherein the input signal inverted by the third inverter is transmitted to the master latch circuit;
    a fourth inverter, coupled between the first node and the slave latch circuit, to receive and invert the first latched signal when the flip-flop is in the first mode, wherein the first latched signal inverted by the fourth inverter is transmitted to the slave latch circuit; and
    a fifth inverter, coupled to the second node, to receive and invert the second latched signal when the flip-flop is in the first mode, wherein the second latched signal inverted by the fifth inverter is transmitted to the output terminal of the flip-flop.

* * * * *